(12) United States Patent
Lammers et al.

(10) Patent No.: US 7,057,924 B2
(45) Date of Patent: Jun. 6, 2006

(54) PRECHARGING THE WRITE PATH OF AN MRAM DEVICE FOR FAST WRITE OPERATION

(75) Inventors: Stefan Lammers, South Burlington, VT (US); Hans-Heinrich Viehmann, South Burlington, VT (US); Thomas M. Maffitt, Burlington, VT (US); John E. Barwin, Jeffersonville, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 275 days.

(21) Appl. No.: 10/758,449

(22) Filed: Jan. 15, 2004

(65) Prior Publication Data

US 2005/0157546 A1    Jul. 21, 2005

(51) Int. Cl.
*G11C 11/14* (2006.01)
(52) U.S. Cl. ............. 365/171; 365/158; 365/173
(58) Field of Classification Search ......... 365/173, 365/158, 159, 171
See application file for complete search history.

(56) References Cited

U.S. PATENT DOCUMENTS 6,594,176 B1 *  7/2003  Lammers ............... 365/171
6,657,889 B1 * 12/2003  Subramanian et al. ...... 365/158

* cited by examiner

*Primary Examiner*—Richard Elms
*Assistant Examiner*—Hien Nguyen
(74) *Attorney, Agent, or Firm*—Slater & Matsil, L.L.P.

(57) ABSTRACT

The write path of an MRAM device is precharged before starting a write operation of a magnetic memory cell, increasing the speed of the write operation and decreasing the write cycle time. The reference wires are precharged, which provides better control over the wordline and bitline write pulses and results in shorter rise times. The precharge time can be hidden in the address decoding time or redundancy evaluation time. A circuit design for a global reference current generator is also described herein. A fast on circuit is also disclosed that increases the speed of precharging the reference wires.

16 Claims, 5 Drawing Sheets

PRECHARGING THE WRITE PATH OF AN MRAM DEVICE FOR FAST WRITE OPERATION

TECHNICAL FIELD

The present invention relates generally to the fabrication of semiconductor devices, and more particularly to the fabrication of magnetic random access memory (MRAM) devices.

BACKGROUND

A more recent development in semiconductor memory devices involves spin electronics, which combines semiconductor technology and magnetics. The spin of an electron, rather than the charge, is used to indicate the presence of a "1" or "0". One such spin electronic device is a magnetic random access memory (MRAM) device 100, as shown in FIG. 1, which includes conductive lines (wordlines WL and bitlines BL) positioned in a different direction, e.g., perpendicular to one another in different metal layers, the conductive lines sandwiching a magnetic stack or magnetic tunnel junction (MTJ) 102, which functions as a magnetic memory cell. Shown in FIG. 2A, a current $I_{WL}$ flowing through one of the conductive lines WL generates a magnetic field around the conductive line WL and orients the magnetic polarity into a certain direction along the wire or conductive line. A current $I_{BL}$ flowing through the other conductive line BL induces the magnetic field and can partially turn the magnetic polarity, also. Digital information, represented as a "0" or "1", is storable in the alignment of magnetic moments. The resistance of the magnetic memory cell 102 depends on the moment's alignment. The stored state is read from the magnetic memory cell 102 by detecting the component's resistive state.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data. Therefore, MRAM devices are replacing flash memory, DRAM and static random access memory devices (SRAM) devices in electronic applications where a memory device is needed.

Because MRAM devices operate differently than traditional memory devices, they introduce design and manufacturing challenges. The speed of the write operation is a critical design feature of an MRAM device.

SUMMARY OF THE INVENTION

Embodiments of the present invention achieve technical advantages by increasing the speed of the write operation time for MRAM devices. The wordline and bitline reference current wires are precharged to a write operation voltage prior to selecting the magnetic memory cells to be written to, increasing the speed of the write operation.

One preferred embodiment of the present invention is a method of writing information to a magnetic memory device. The magnetic memory device includes a plurality of wordlines in a first wiring level positioned in a first direction, a plurality of bitlines in a second wiring level positioned in a second direction, and a plurality of magnetic memory cells, each magnetic memory cell being proximate an intersection of a wordline and a bitline. The method includes precharging the write path of the magnetic memory device, and after precharging, then selecting at least one magnetic memory cell. The method includes writing to the at least one magnetic memory cell.

In accordance with another preferred embodiment of the present invention, a magnetic memory device includes a plurality of wordlines in a first wiring level positioned in a first direction, a plurality of bitlines in a second wiring level positioned in a second direction, and a plurality of magnetic memory cells, each magnetic memory cell being proximate an intersection of a wordline and bitline, the magnetic memory cells being arranged in a plurality of sub-arrays. A local write current generator is coupled to each sub-array, and a global reference current generator is coupled to at least one input of the local write current generators, wherein the global reference current generator precharges the at least one input of the local write current generators with a global reference current before at least one magnetic memory cell is written to in a write operation.

In accordance with yet another preferred embodiment of the present invention, a global reference current generator for a magnetic memory device includes a precharge mode current reference generator, an active mode reference current generator, and a control logic circuit coupled to the active mode reference current generator. An oscillator is coupled between the control logic circuit and the precharge mode current reference generator, wherein a global reference current is generated from either the precharge mode current reference generator in a precharge mode, or from the active mode reference current generator in an active mode.

In accordance with another embodiment of the present invention, a circuit includes a first transistor coupled to a first reference voltage, a transfer gate coupled to the first transistor, and a comparator coupled to the transfer gate at an enable input of the comparator. A second transistor is coupled to an output of the comparator, and a third transistor is coupled to an input of the comparator and the transfer gate, wherein an input of the comparator and the second transistor are coupled to a second reference voltage. A start signal input to the transfer gate triggers the charging of the second reference voltage to a predetermined voltage level.

Advantages of preferred embodiments of the present invention include increasing the speed of the write operation of a magnetic memory device, and decreasing the write cycle time. The wordline write current, or the current that generates the hard axis field, is turned on completely before the bitline current (the current that generates the easy axis field) is activated, and after the write operation, the wordline write current turns off completely before the bitline current is deactivated, which is a desired timing characteristic for writing to a magnetic memory device. Embodiments of the present invention provide improved control over the wordline and bitline write current pulses and shorter rise times. The time required to precharge the input node of the local write current generators may be hidden in the decoding time or in the redundancy evaluation time of the memory device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. Embodiments of the present invention may also be applied, however, to other magnetic memory cell designs and magnetic semiconductor device applications.

Figure 1:
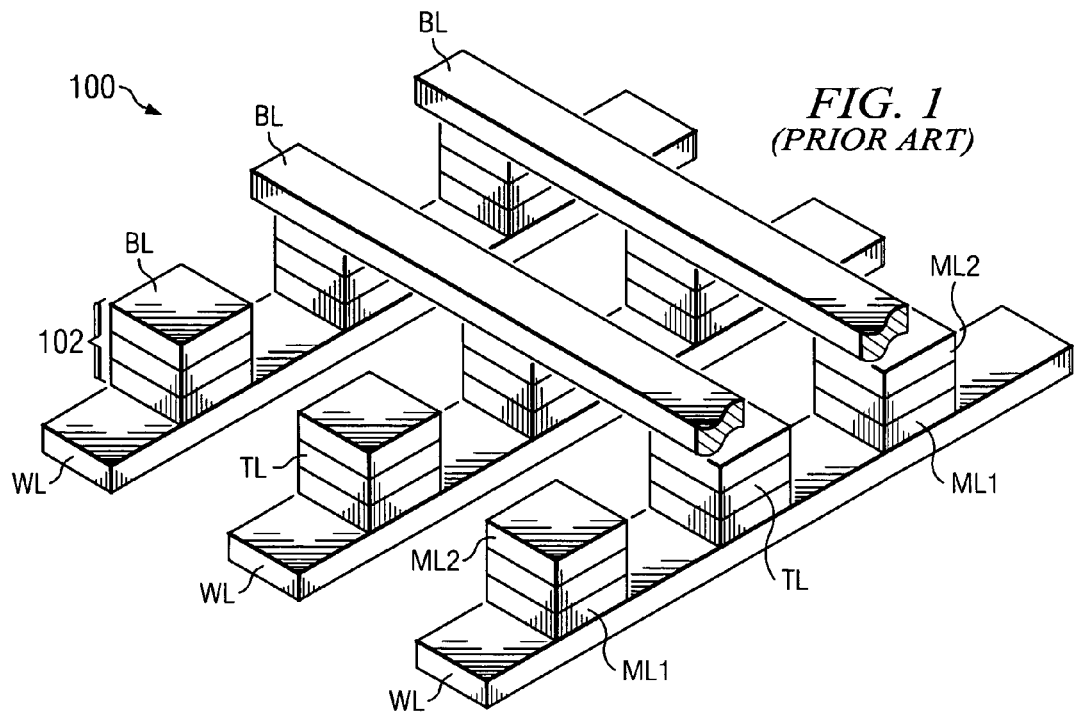
FIG. 1 illustrates a perspective view of a prior art MRAM device having magnetic stack memory cells arranged in an array, with wordlines and bitlines disposed below and above each memory cell for accessing the memory cells.

FIG. 1 shows a perspective view of a portion of a prior art cross-point MRAM array 100. The MRAM device 100 includes a semiconductor wafer comprising a workpiece (not shown). The workpiece has a first insulating layer (also not shown) deposited thereon, and a plurality of first conductive lines or wordlines WL is formed within the first insulating layer, e.g., in a first wiring level. The wordlines WL may comprise copper, aluminum, combinations thereof, and/or other metals, for example.

In a cross-point magnetic memory device 100, each memory cell or magnetic tunnel junction (MTJ) 102 is disposed over and abuts one wordline WL, as shown. The MTJ 102 of a magnetoresistive memory comprises three layers ML1, TL and ML2. The MTJ 102 includes a first magnetic layer ML1 disposed over and abutting the wordline WL. The first magnetic layer ML1 is often referred to as a fixed layer because the magnetic orientation is fixed. A tunnel layer or tunnel barrier TL comprising a thin dielectric layer is formed over the fixed layer ML1. A second magnetic layer ML2 is formed over the tunnel layer TL. The second magnetic layer ML2 is often referred to as a free layer because the magnetic orientation can be switched in one of two directions depending on the logic state of the memory cell. The first and second magnetic layers ML1 and ML2 may comprise one or more magnetic material layers, for example.

Each MTJ 102 has a second conductive line or bitline BL disposed over and abutting the second magnetic layer ML2, as shown in FIG. 1, wherein the bitline BL is positioned in a direction different from the direction of the wordline WL, e.g., the bitlines BL may be orthogonal to the wordlines WL. An array 100 of magnetic memory cells 102 comprises a plurality of wordlines WL running parallel to one another in a first direction, a plurality of bitlines BL running parallel to one another in a second direction, the second direction being different from the first direction, and a plurality of MTJ's 102 disposed between each wordline WL and bitline BL. While the bitlines BL are shown on top and the wordlines WL are shown on bottom of the array 100, alternatively, the wordlines WL may be disposed on the top of the array and the bitlines BL may be disposed on the bottom of the array, for example.

Figure 2A:
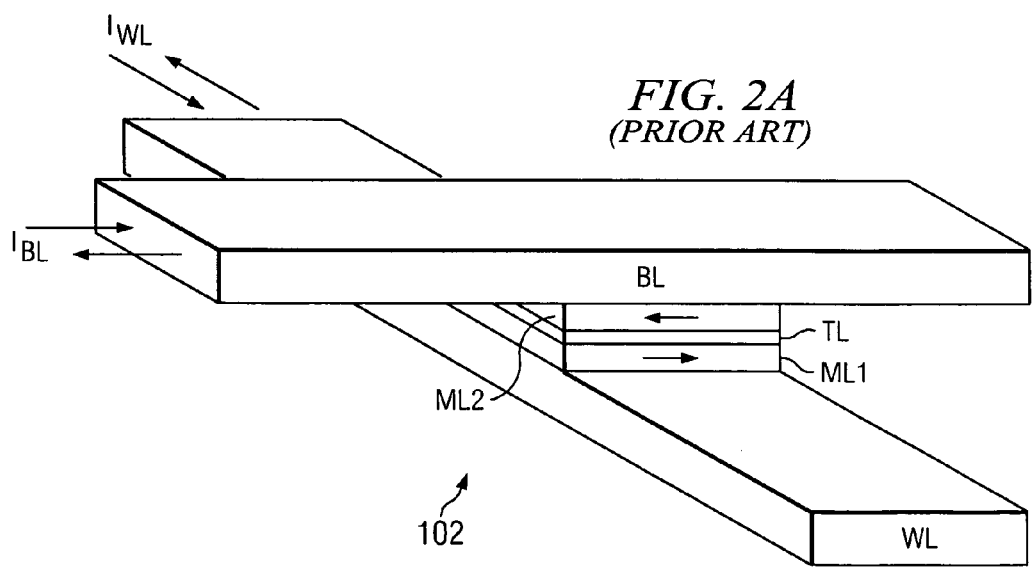
FIG. 2A through 2C illustrate a single magnetoresistive memory cell and the currents used to program the cell.
Figure 2B:
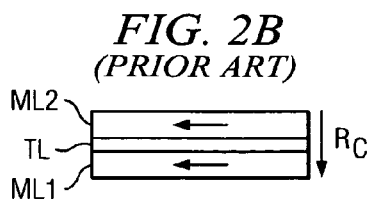
Figure 2C:
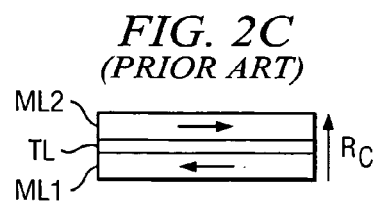

Either one of the first or second magnetic layers ML1 and ML2 may comprise a hard magnetic material (and is the fixed layer) the other comprises a soft magnetic material (and is the free layer), although in the discussion herein, the first magnetic layer ML1 comprises the hard magnetic material, and the second magnetic layer ML2 comprises the soft magnetic material. The value of the resistance of the cell or MTJ 102 depends on the way in which the magnetic dipoles of the soft magnetic layer ML2 are oriented to the dipoles of the hard magnetic layer ML1. If the first and second magnetic layers ML1 and ML2 are oriented in the same direction, as shown in FIG. 2B, the cell resistance $R_c$ is low. If the first and second magnetic layers ML1 and ML2 are oriented in opposite directions, shown in FIG. 2C, the cell resistance $R_c$ is high. These two states of the cell are used to store digital information (a logic "1" or "0", high or low resistance, or vice versa).

The hard magnetic layer ML1 is usually oriented once during manufacturing. The information of the cell 102 is stored in the soft magnetic layer ML2. Shown in FIG. 2A, the currents $I_{WL}$ and $I_{BL}$ through the wordline WL and bitline BL, respectively, provide the magnetic field that is necessary to store information in the soft magnetic layer ML2. The superimposed magnetic field of the bitline BL and wordline WL current has the ability to switch the magnetic dipoles in the soft magnetic layer ML2 and change the logic state of the cell 102.

Figure 3:
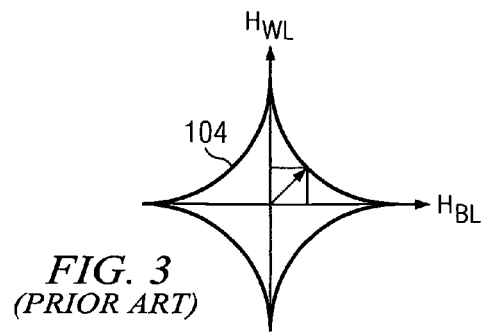
FIG. 3 shows an asteroid curve representing switching characteristics of an MRAM memory cell.

MRAM cells 102 have a switching characteristic in the shape of an asteroid curve 104, as shown in FIG. 3. The asteroid curve 104 is defined by Eq. 1:

$$H_{WL}^{2/3}+H_{BL}^{2/3}=H_K^{2/3}, \quad\quad\quad \text{Eq. 1}$$

where $H_K$ is the coercivity, and $H_{WL}$ and $H_{BL}$ are the magnetic fields generated by the currents of the wordline WL and bitline BL, respectively. To switch the soft magnetic layer ML2 of the cell 102, the superposition of the bitline BL and wordline WL field has to be large enough to go outside the asteroid curve. In the soft magnetic layer ML2, one of these fields, referred to as the easy axis field, which in this example is $H_{BL}$ along the horizontal axis in FIG. 3, is oriented parallel to the switching axis. The other field, called the hard axis field, is oriented orthogonal to the switching axis, which in this example is $H_{WL}$ along the y axis.

One possible approach to writing to magnetic memory cells of an MRAM device could be to issue a write command, select a sub-array in which the selected magnetic memory cell, and send a reference current is sent from a global reference current generator to a local write current generator for the sub-array so that the local write current generator can generate a write current and write to the selected magnetic memory cell. However, this approach would be problematic because it takes time for the reference current to flow from the global reference current generator and charge up the capacitance of the write path to the voltage potential required to generate the local write current. The write path of the MRAM device includes the input nodes of the local write current generator, the wires or conductive lines, and the internal nodes of the local write current generator and global reference current generator, as examples. The charge time required is due to the time needed to charge up the capacitance of the wiring and various nodes in the write path. This charge time has a large impact on the write cycle time.

The charge time may be decreased by increasing the amount of the reference current, but this increases the static current, increasing the power consumption. If the input nodes of the local write current generators remain constantly charged, then current is constantly consumed, which increases power consumption for the MRAM device. MRAM devices are planned for use in battery-powered applications such as cellular phones, and low power consumption of memory cells is very important to prolong battery life.

Therefore, what is needed in the art is a design for an MRAM device having faster write cycle times that requires a minimal amount of static current.

Embodiments of the present invention achieve technical advantages by providing a write concept that increases the write operation speed by decreasing the time required for a write operation in MRAM devices. The write cycle speed is increased by precharging the write path to the required voltage levels before applying a write voltage signal to the magnetic memory cells, and also before even selecting the magnetic memory cells to be written to.

Figure 4:
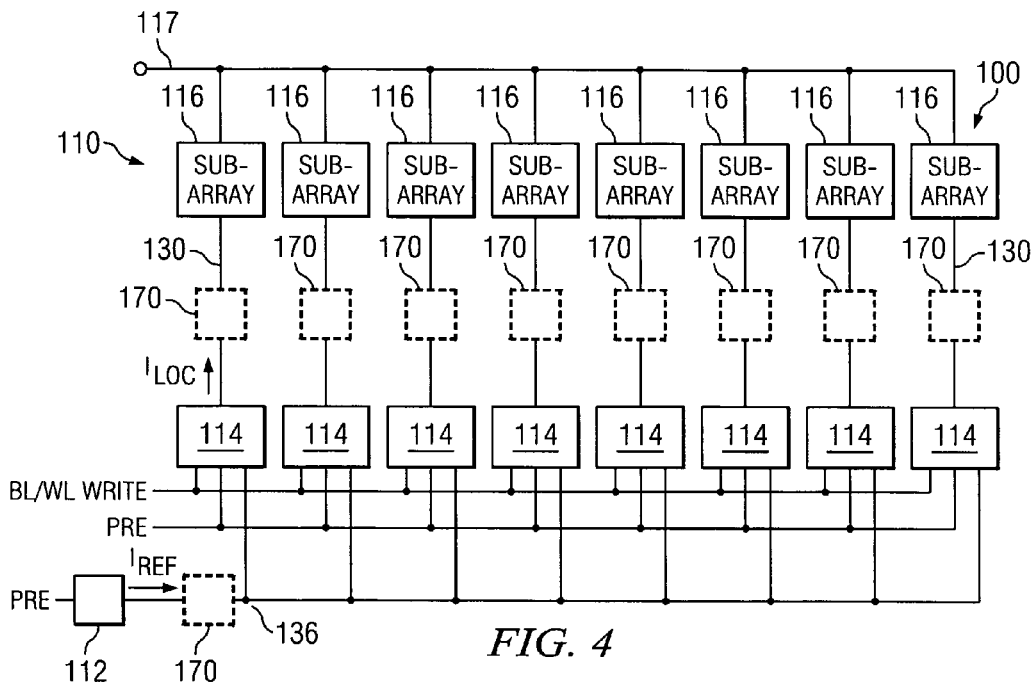
FIG. 4 illustrates a wordline/bitline write path for an MRAM array in accordance with a preferred embodiment of the present invention, wherein the write path of the MRAM array is precharged prior to activating the wordline and bitline select signals.

FIG. 4 shows a write path for bitlines and wordlines for an MRAM device 100 in accordance with an embodiment of the present invention. The write path 110 shown illustrates a possible reference current distribution within an MRAM device 100. Each sub-array 116 comprises a plurality of wordlines WL, bitlines BL, and MTJ's 102 (not shown in FIG. 4; see FIG. 1.) The write currents for MRAM cells in the sub-arrays 116 are generated locally from a local write current $I_{LOC}$ by local write current generating circuits 114. A global reference current $I_{REF}$ is distributed from a global reference current generator 112 to a local write current generator 114 located at each sub-array 116.

Because the global reference current $I_{REF}$ is sent over a large surface area of the device 110, it is not desirable to distribute it over the entire chip. Rather, it is desirable to distribute a smaller current over the entire chip, to avoid a large voltage drop across the conductive lines and to reduce the power consumption for the chip. Therefore, locally, close to the sub-arrays 116, each local write current generator 114 generates a local write current $I_{LOC}$ which is used in each sub-array 116 to write or store information to the magnetic memory cells 102. The local write current $I_{LOC}$ is shown in FIG. 4 as a single current or signal; however, the current $I_{LOC}$ actually represents two write currents $I_{WL}$ and $I_{BL}$, which are shown in the timing diagram of FIG. 7. The bitline current for each sub-array 116 may alternatively comprise two separate bitline currents, one flowing one way, and the other flowing in an opposite direction (e.g. in FIG. 2C). The global reference current $I_{REF}$ may be orders of magnitude smaller than the local write current $I_{LOC}$, for example, $I_{LOC}$ may be about 100 times larger than $I_{REF}$. The current $I_{REF}$ may comprise a single reference current from which the write currents $I_{WL}$ and $I_{BL}$ are generated from. Alternatively, there may be two or three reference currents $I_{REF}$, one for each write current $I_{WL}$ or $I_{BL}$. Each sub-array 116 includes a plurality of magnetic memory cells 102, wordlines and bitlines (not shown in FIG. 4; see FIGS. 1 and 2).

The amount of time needed to charge up the reference current wire 136 to the voltage potential required by the local write current generator 114 is a significant percentage of the time required for a write operation. In accordance with embodiments of the present invention, the reference current wires 136 (e.g., the wires 136 for reference current $I_{REF}$ between the output of the global reference current generator 112 and the inputs of the local write current generators 114) are precharged before the write operation is activated, reducing the time needed for charging up the wires 136.

To precharge the wires 136, a precharge signal PRE is input to the global reference current generator 112 and also to each local write current generator 114, as shown in FIG. 4. Signal PRE is shown as 140 in FIG. 7, to be discussed further herein. Write trigger signals WL WRITE and BL WRITE are input into each local write current generator 114 (for ease of discussion, the two separate signals WL WRITE and BL WRITE are shown as a single input to the local write current generators 114, at BL/WL WRITE in FIG. 4). The wordline write trigger signal WL WRITE is shown at 120 in FIG. 7, and the bitline write trigger signal BL WRITE is shown at 122 in FIG. 7. Address signal 117, which includes a sub-array select signal and the addresses of the bitlines BL and wordlines WL, is input to each sub-array 116. The address signal 117 preferably comprises a digital signal comprised of $V_{DD}$ or ground, for example.

In accordance with embodiments of the present invention, precharging the wires 136 may be achieved by sending a reference current $I_{REF}$ through the reference wires 136, as shown in FIG. 4, or alternatively by clamping the reference wires 136 to a defined voltage potential before the write operation is issued. The time required to charge the input node of the local write current generators 114 may be hidden in the decoding time or in the redundancy evaluation time of the memory device 100.

When the write path 110 is enabled and writing to the sub-arrays 116 is initiated, this starts the precharging of the local write current generator 114 inputs (wire 136), but the write cycle is not actually started initially. The voltage potential of the wire 136 is brought up to the level required for writing, and after one or more sub-arrays 116 are selected, then the write signal can be written directly by current $I_{LOC}$ generated by the local write current generators 114, without having to precharge the wire 136 first.

When a write signal BL/WL WRITE is received, initially, it is unknown which sub-array 116 is selected. The memory cell selection information is in the address signal 117, and the memory cell selection is achieved by decoding the address signal 117. Therefore, preferably, in accordance with an embodiment of the present invention, all of the sub-arrays 116 are precharged, and then, after a certain time period, during which encoding and redundancy analysis may also be done, when the voltage at the input of the local write current generators 114 (at wires 136) is at the required write voltage, then the write operation can be initiated. One or more sub-arrays 116 may be selected and written to at the same time, depending on the address signal 117. It takes a few nanoseconds or so to bring the address signals to the decoders, and this time is used to precharge the wires that $I_{REF}$ is applied to.

Embodiments of the present invention achieve technical advantages by precharging the inputs of the local write current generators 114 shortly before the memory cells 102 of the MRAM array 100 are written to. When a write cycle is initiated with a "write on" signal (at BL/WL WRITE), it is important to make sure the node or wire 136 (where $I_{REF}$ is input to each local write current generator 114) is already charged up, so that no time is lost from the time the "write on" signal goes on to charge up the wire. Embodiments of the present invention ensure that all of the inputs of the local write current generators 114 have the voltage potential they need in the normal write operation.

Figure 5:
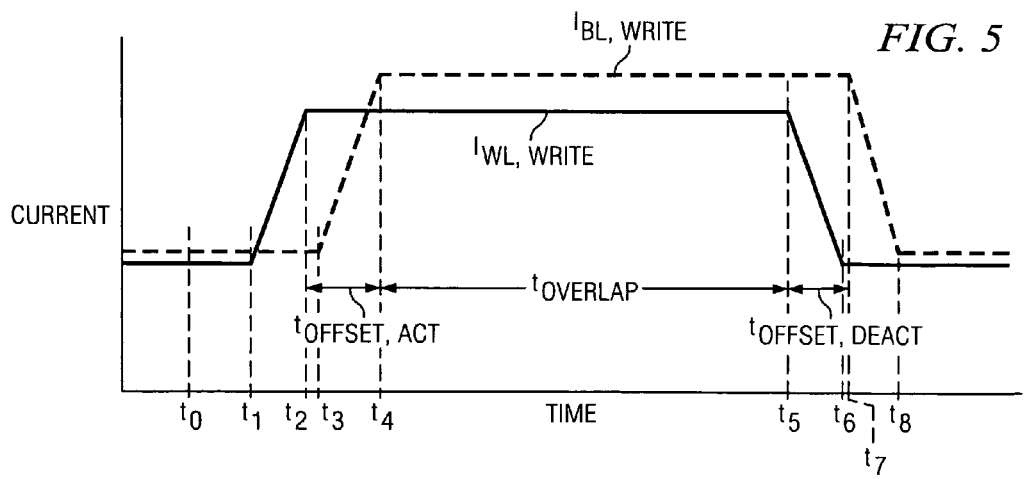
FIG. 5 shows an ideal timing diagram for a write operation of a magnetoresistive memory cell, wherein the wordline write current pulse or current that generates the hard axis field precedes the bitline write current pulse or current that generates the easy axis field.

FIG. 5 shows an ideal write timing in MRAM devices that provides the most reliable write operation. Preferably, both of the write currents ($I_{BL}$, write and $I_{WL}$, write, which correspond to BL/WL WRITE in FIG. 4) are not sent to the sub-arrays 116 (shown in FIG. 4) at the same time. The WL current pulse ($I_{WL}$, write) (the current that generates the hard axis $H_{WL}$ field of FIG. 3) should precede the BL current pulse ($I_{BL}$, write) (the current that generates the easy axis $H_{BL}$ field of FIG. 3). Turning the WL current pulse on before the BL current pulse is turned on is important, and turning the WL current pulse off before the BL current pulse is turned off is important, to achieve the desired alignment of the dipoles of the magnetic layers ML1 and ML2 of the memory cell 102 shown in FIG. 2 during a write operation.

The ideal timing diagram shown in FIG. 5 will next be described. At time $t_0$, both current signals ($I_{WL}$, write and $I_{BL}$, write) are off. At time $t_1$, a first current signal ($I_{WL}$, write) should be turned on. It takes a certain amount of time, e.g., a few nanoseconds, for the first current signal ($I_{WL}$, write) to reach its maximum level at $t_2$. After the maximum level is reached, at $t_3$, the second current signal ($I_{BL}$, write) should be turned on. It takes a certain amount of time for the second current signal ($I_{BL}$, write) to reach its maximum level at $t_4$. The amount of activating offset $t_{offset,act}$ is equal to the time between times $t_4$ and $t_2$.

Similarly, after the write operation, the first current signal ($I_{WL}$, write) should be turned off before the second current signal ($I_{BL}$, write). The first current signal ($I_{WL}$, write) is turned off at time $t_5$. The amount of overlap time $t_{overlap}$ when both current signals are on is equal to the time between times $t_5$ and $t_4$. It takes a certain amount of time for the current to turn off completely, at time $t_6$. After the first current signal ($I_{WL}$, write) is turned off completely, then the second current signal ($I_{BL}$, write) should be turned off at time $t_7$. The amount of activating offset $t_{offset,deact}$ is equal to the time between times $t_7$ and $t_5$. It then takes a certain amount of time for the current to turn off completely, at time $t_8$. Note that the WL and BL current $I_{WL}$ and $I_{BL}$ magnitudes required for writing can be different, depending on the switching characteristics of the magnetic memory cells 102 (shown in FIG. 2).

Figure 6:
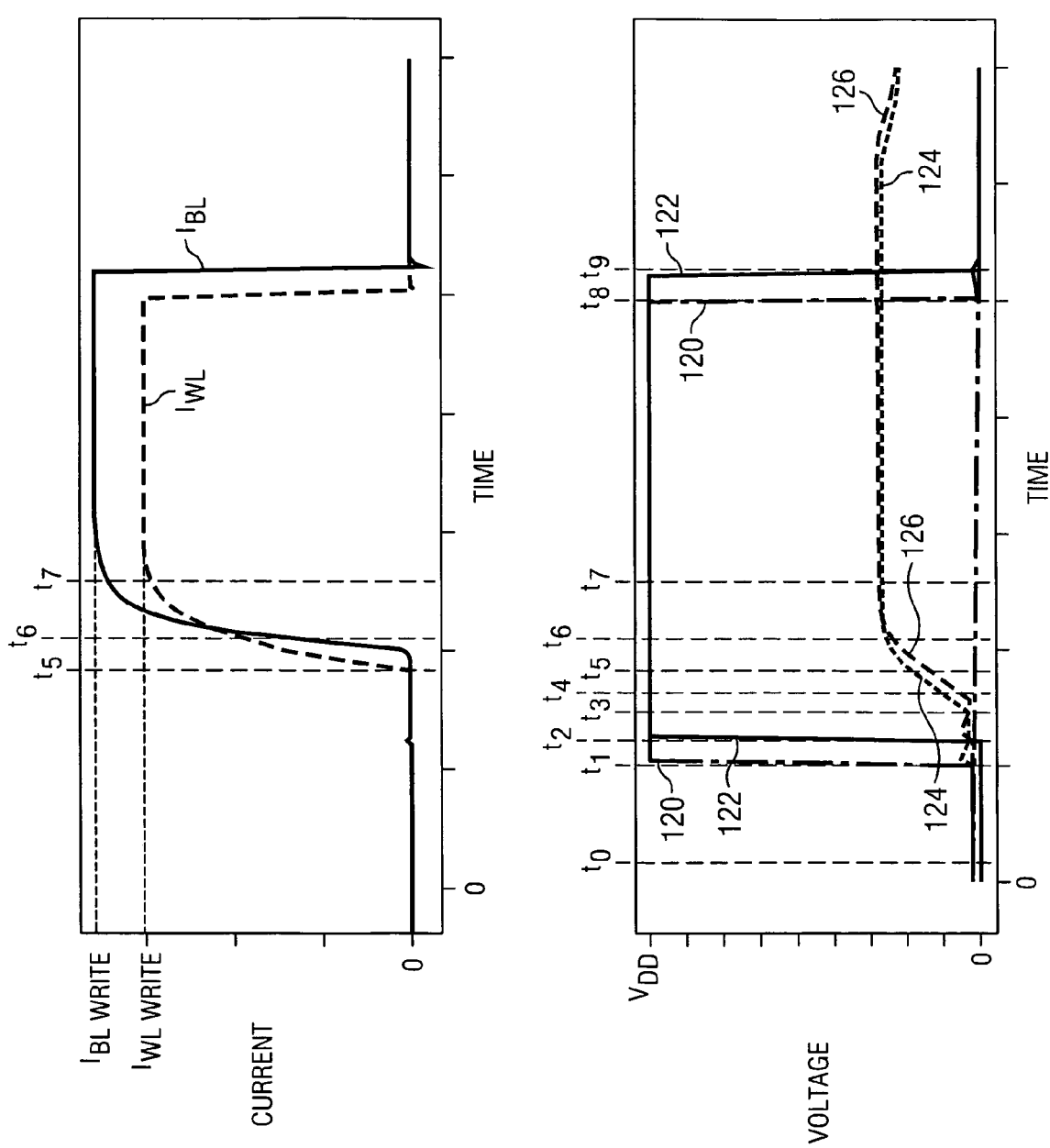
FIG. 6 is a timing diagram of a prior art MRAM array.
Figure 7:
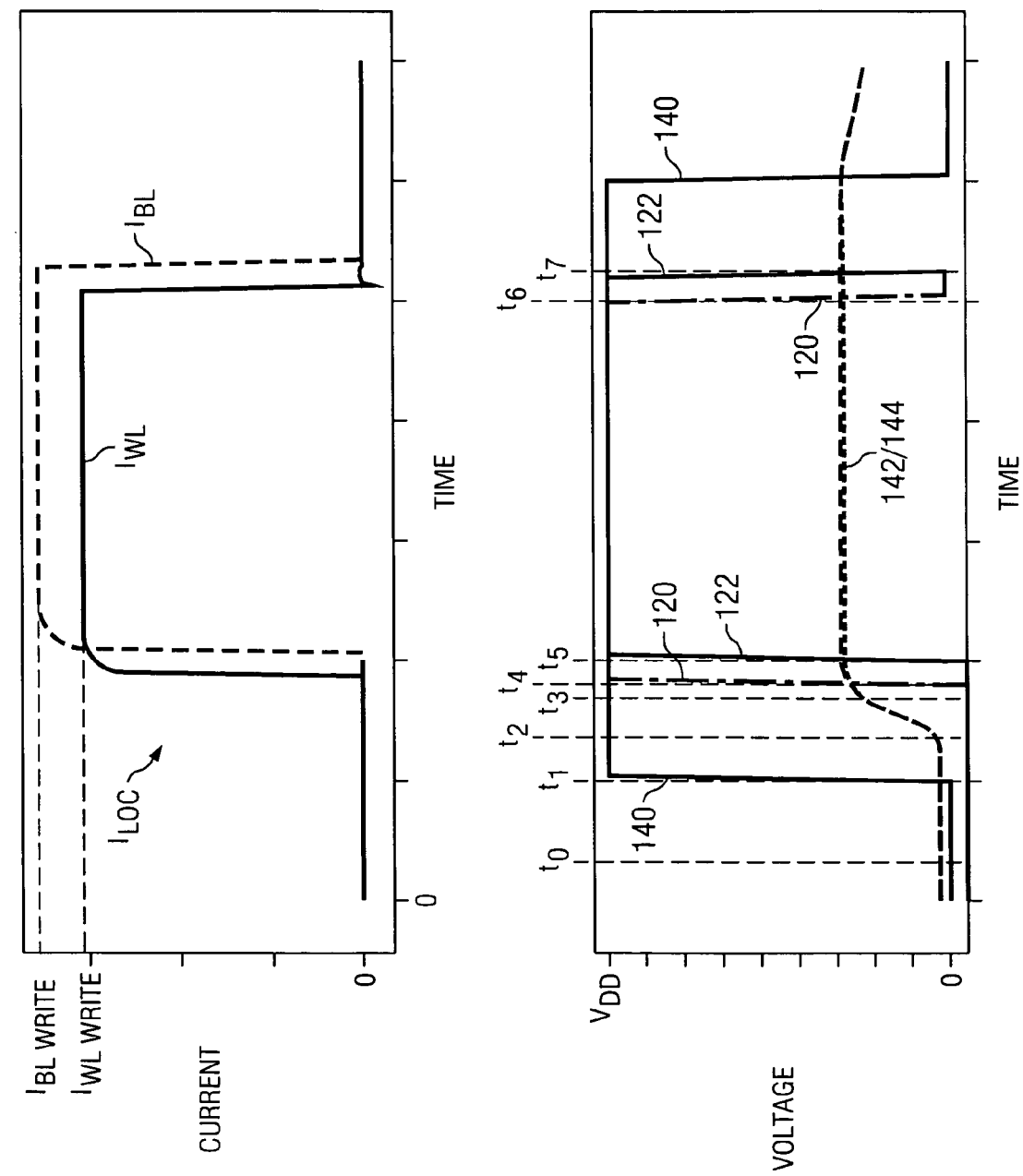
FIG. 7 is a timing diagram of an MRAM array wherein the wordlines and bitlines are precharged before activating the wordline and bitline select signals in accordance with an embodiment of the present invention.

Advantages of the present invention may be easily seen with reference to the ideal timing diagram shown in FIG. 5, compared with the simulation results of a prior art MRAM design in FIG. 6 and the simulation results of an embodiment of the present invention, shown in FIG. 7. FIG. 6 shows a write simulation for a prior art MRAM device where the reference wires are not precharged before the write operation is started. The top part of the figure shows current and the bottom part shows voltage. In the top part of the figure, the two write currents $I_{BL}$ and $I_{WL}$ are shown, and in the bottom part, a trigger signal 120 for the wordline and a trigger signal 122 for the bitline are shown. The voltage 142 at the input of the local write current generators (such as the generators 114 shown in FIG. 4) for the bitlines and the voltage 144 at the input of the local write current generators for the wordlines are also shown.

At time $t_0$, both of the write currents $I_{BL}$ and $I_{WL}$ are off. At time $t_1$, the trigger signal 120 for the wordline write current $I_{WL}$ is initiated, and input $I_{REF}$ to the local write current generators begins charging. It takes some time for the input voltage of the local write generators for the wordlines to charge, e.g., from time $t_4$ to time $t_6$. The wordline write current $I_{WL}$ begins to turn on at time $t_5$, and the wordline write current $I_{WL}$ reaches its maximum level at time $t_7$. Then, at time $t_2$, the trigger signal 122 for the bitline write current $I_{BL}$ is initiated, and the input $I_{REF}$ to the local write current generators begins charging. Again, it takes some time for the input voltage of the local write generators for the bitlines to charge, e.g., from time $t_3$ to time $t_6$. The bitline write current $I_{BL}$ begins to turn on at time $t_6$, and the bitline write current $I_{BL}$ reaches its maximum level at time $t_7$, the same time as the wordline write current $I_{WL}$ reaches its maximum level, which is undesirable, as described with reference to the timing diagram in FIG. 5. At time $t_8$, the wordline write trigger signal 120 is deactivated, and the write current $I_{WL}$ turns off. At time $t_9$, the bitline write trigger signal 122 is deactivated, and the write current $I_{BL}$ turns off.

There are several other problems with the timing diagram of the prior art MRAM device. It takes a long time to turn on the currents $I_{WL}$ and $I_{BL}$, e.g., several nanoseconds, to their maximum levels. For example, the wordline write current $I_{WL}$ is initiated at time $t_1$ but does not reach its maximum value until time $t_7$, and the bitline write current $I_{BL}$ is initiated at time $t_2$ but does not reach its maximum value until time $t_7$. The bitline and wordline currents $I_{WL}$ and $I_{BL}$ undesirably turn on or achieve their maximum levels at the same time due to the different amount of the currents, e.g., the bitline current $I_{BL}$ is greater than the wordline current $I_{WL}$, so the bitline current $I_{BL}$ charges the wires faster. Thus, although the write control signal 120, which activates the WL write current $I_{WL}$, is issued before the BL write control signal 122, which activates the BL write current $I_{BL}$, both currents $I_{WL}$ and $I_{BL}$ appear at the magnetic memory cell simultaneously using the prior art write concept.

FIG. 7 shows a write simulation wherein the reference wires are precharged before the write operation utilizing a circuit such as the one shown in FIG. 4, in accordance with an embodiment of the present invention. Comparing the simulations of FIG. 7 to FIG. 6, the advantages of the novel write procedure and MRAM device described herein can be seen. At time $t_0$, the wordline write current and bitline write currents $I_{WL}$ and $I_{BL}$ are turned off. At time $t_1$, a precharge signal 140 (corresponding to signal PRE in FIG. 4) is initiated that triggers the precharge of the inputs of the local write current generators 114 of FIG. 4. The input voltages 142 and 144 (e.g. the voltages that generate current $I_{LOC}$ in FIG. 4) of the local write current generators 114 due to the precharge begins increasing at time $t_2$, and the input voltages 142 and 144 have reached a substantial percentage, e.g., about 80 to 90% of their maximum value, at time $t_3$ because of the precharge, for example. At time $t_4$, the wordline write current $I_{WL}$ is initiated by the "write on" wordline write trigger voltage signal 120 (WL WRITE of FIG. 4), and because the input voltage of the local write current generators 114 is precharged, the write current $I_{WL}$ turns on, also at time $t_4$. At time $t_5$, the bitline write current $I_{BL}$ is initiated by the "write on" bitline voltage signal 122 (BL WRITE of FIG. 4), and because the input voltage of the local write current generators 114 are precharged, the write current $I_{BL}$ turns on, also at time $t_5$. The write currents $I_{WL}$ and $I_{BL}$ are represented by local current $I_{LOC}$ in FIG. 4. Note the steep curves of the turn-on of the currents $I_{WL}$ and $I_{BL}$, which indicate that these write currents turn on very quickly. Also note that the wordline write current $I_{WL}$ is turned on before the bitline write current $I_{BL}$, as is desired in the ideal timing diagram of FIG. 5.

Referring again to FIG. 7, at time $t_6$, the write off wordline signal 120 triggers the $I_{WL}$ to turn off, and at time $t_7$, the write off bitline signal 122 signal triggers the $I_{BL}$ to turn off. After both of the write currents $I_{WL}$ and $I_{BL}$ are turned off, the trigger signal for the precharge 140 is turned off, at time $t_8$.

Precharging the reference wires before starting the write operation of the MRAM cell provides a faster write operation, as shown in FIG. 7. In addition, the ideal write timing diagram shown in FIG. 5 can be more easily achieved with the novel write concept described herein. A further advantage of embodiments of the present invention comprises improved control over the wordline and bitline write current pulses $I_{WL}$ and $I_{BL}$, with shorter rise times.

Figure 8:
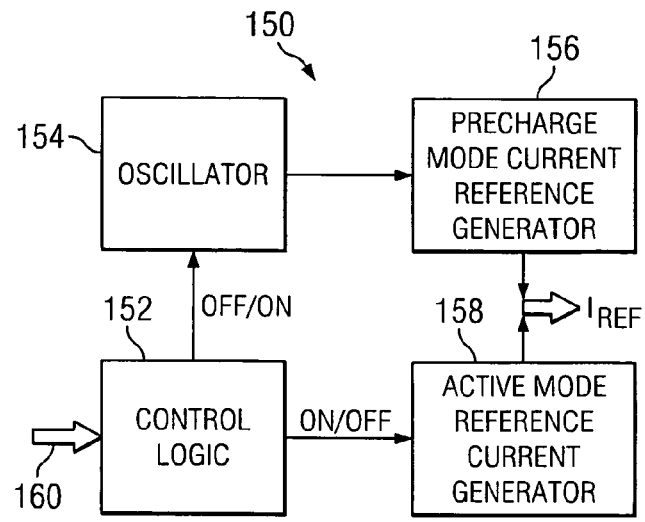
FIG. 8 shows a design for a global reference current generator according to a preferred embodiment.

FIG. 8 illustrates an example of a global reference current generator 150 that may be used to precharge the current wires 136 (see FIG. 4) or inputs of the local write current generators 114. The circuit 150 may be coupled to the inputs of the local write current generators 114 in place of the global reference current generator 112 shown in FIG. 4. A control logic circuit 152 is adapted to receive a control signal 160. The control logic circuit 152 is controllably coupled to an active mode reference current generator 158 and an oscillator 154. The oscillator 154 is coupled to an input of a precharge mode current reference generator 156. The precharge mode current reference generator 156 and the active mode reference current generator 158 are alternatively selected to generate an output voltage and provide the global reference current $I_{REF}$.

A signal 160 is input to control logic 152, to enable switching between an active and precharge mode. In the active mode, the MRAM device is enabled, e.g., in a write operation. In the active mode, the control logic circuit 152 is "on" and the active mode reference current generator 158 generates the current $I_{REF}$. In the precharge mode, the MRAM device is not enabled and the control logic circuit is "off", and the oscillator 154 is used to trigger the precharge mode current reference generator 156 which measures the reference current $I_{REF}$ voltage, and precharges the reference voltage of $I_{REF}$ to a certain voltage level. When the reference voltage drops down or decreases, then the voltage of $I_{REF}$ is charged back up to the correct voltage potential. When the mode is switched back to the active mode, the wires are already charged up to the correct voltage level, and the MRAM device is ready to write.

In the precharge mode, the oscillator 154 counts periodically, e.g., every 1 microsecond or other time intervals, and triggers the precharge mode current reference generator 156 to precharge the output at $I_{REF}$. Then the oscillator 154 turns the precharge mode current reference generator 156 off. As long as the global reference current generator 150 stays in the precharge mode, the oscillator 154 continually triggers the precharge mode current reference generator 156 to keep charging up the $I_{REF}$ voltage. The circuit 150 decreases the write cycle time of the MRAM device because there is no precharging time required.

Advantages of preferred embodiments of the present invention include increasing the speed of the write operation of an MRAM device, and decreasing the write cycle time. The wordline write current $I_{WL}$ is turned on completely before the bitline current $I_{BL}$ is activated, and after the write operation, the wordline write current $I_{WL}$ turns off completely before the bitline current $I_{BL}$ is deactivated, which is a desired timing characteristic for writing to a magnetic memory device. Embodiments of the present invention provide improved control over the wordline and bitline write current $I_{WL}$ and $I_{BL}$ pulses and shorter rise times. The time required to precharge the input node 136 of the local write current generators 114 may be hidden in the address decoding time or in the redundancy evaluation time of the memory device 100.

Figure 9:
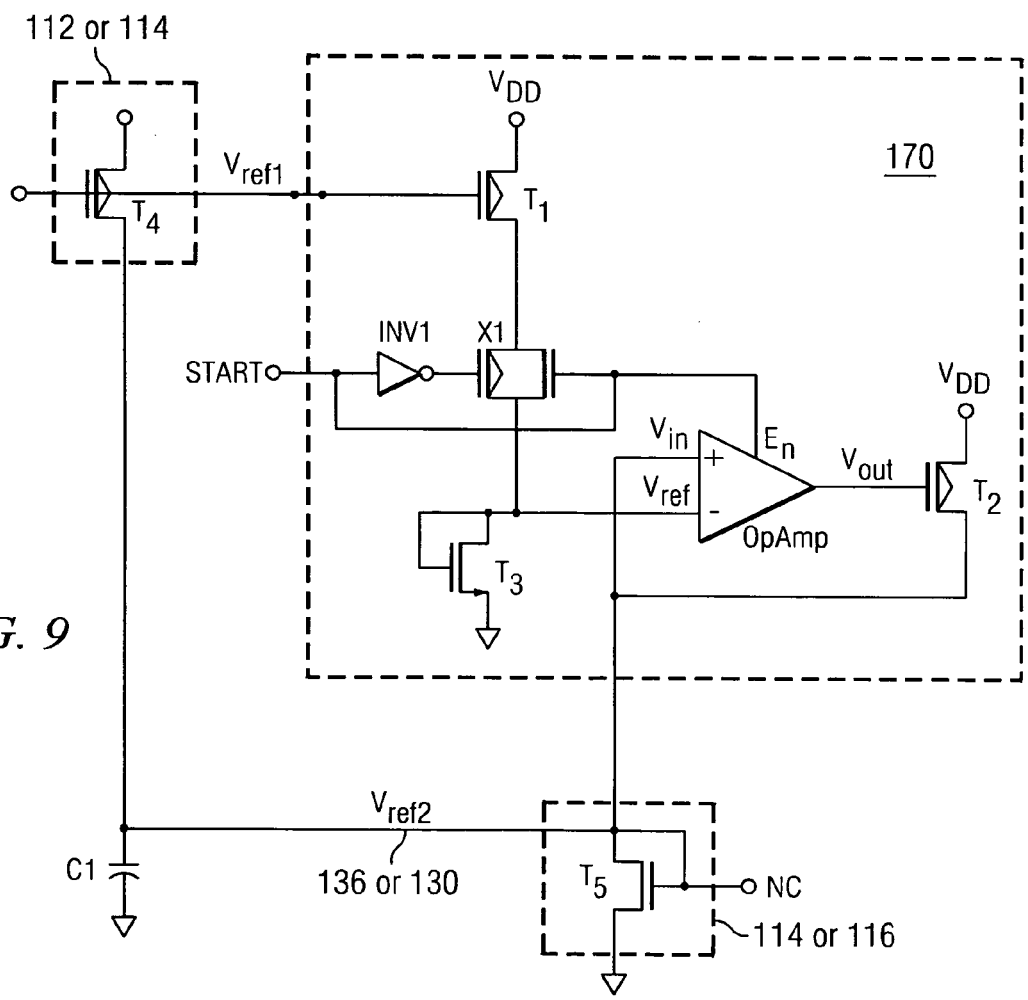
FIG. 9 is a schematic of a "fast on circuit" that further decreases the precharge time of the reference wires.

In another embodiment of the invention, the speed of precharging of the references wires 136 or the output wires 130 of the local write current generators may be increased by the use of a fast on circuit 170 shown in FIG. 9 (and also shown in phantom in FIG. 4). The circuit 170 includes a PFET transistor T1 and an NFET transistor T3 with a transfer gate X1 coupled therebetween. The transistors T1 and T3 function as a local current mirror without loaded lines or distributed net (node 136 or 130 in FIG. 9), and creates a quick reference. Transistors T1 and T3 are preferably selected to have a ratio of characteristics (such as resistance, capacitance, etc.) such that the voltage Vref at the input of the operational amplifier OpAmp can be charged to a predetermined voltage quickly (e.g., substantially faster than nodes 130 and 136). The transfer gate X1 functions to turn on and off the local current mirror comprised of T1 and T3.

In FIG. 9, the fast on circuit is shown at 170, and the other elements T4, C1 and T5 represent the reference current circuit that is distributed in the MRAM array shown in FIG. 4. Transistor T4 may comprise a PFET, for example, which may comprise a transistor within the global reference current generator 112, if the fast on circuit 170 is coupled between the global reference current generator 112 and the local write current generator 114, as shown in phantom in FIG. 4. Alternatively, the transistor T4 may comprise a transistor located within the local write current generator 114, if the fast on circuit 170 is coupled between the local write current generator 114 and the sub-arrays 116, also shown in phantom in FIG. 4.

Transistor T5, which may comprise an NFET, for example, is coupled on the output side of the circuit 170. The transistor T5 may comprise a transistor located within the local write current generator 114, if the fast on circuit 170 is coupled between the global reference current generator 112 and the local write current generator 114, as shown in phantom in FIG. 4. Alternatively, transistor T5 may comprise a transistor located within each sub-array 116, if the fast on circuit 170 is coupled between the local write current generator 114 and the sub-arrays 116, also shown in phantom in FIG. 4. The capacitor C1 represents the capacitance of the wire that is being precharged (such as 136 or 130 in FIG. 4).

The fast on circuit 170 includes a first transistor T1 coupled to a first reference voltage Vref1. The first reference voltage Vref1 may comprise a voltage within the global reference current generator 112 or the local write current generator 114, as examples. First transistor T1 may comprise a PFET coupled to a voltage source $V_{DD}$, as shown, for example. If the fast on circuit 170 is coupled between the local write current generators 114 and global reference current generator 112, as shown in phantom on FIG. 4, the first reference voltage Vref1 may comprise a voltage from global reference current generator 112, for example.

Referring again to FIG. 9, a transfer gate X1 is coupled to the transistors T1 and T3. The START signal turns off the circuit 170 so that power is not used when it is not necessary. An optional inverter INV1 may be coupled to the transfer gate X1, as shown. A START signal (which may be derived or triggered by the precharge signal PRE of FIG. 4, for example) is coupled to the transfer gate X1 and the enable input of a comparator, which may comprise an operational amplifier OpAmp, as shown. The input of the optional inverter INV1 may also be coupled to the enable input of the comparator (OpAmp).

A second transistor T2 is coupled to an output of the comparator OpAmp. The second transistor T2 may comprise a PFET that is coupled to a voltage source $V_{DD}$, as shown. A third transistor T3 is coupled to an input of the comparator OpAmp and the transfer gate X1, wherein an input of the comparator OpAmp and the second transistor T2 are coupled to a second reference voltage Vref2, which is represented by 136 in FIG. 4. The second reference voltage Vref2 comprises the voltage that provides $I_{REF}$ at node 136 in FIG. 4, if the fast on circuit 170 is coupled between the local write current generators 114 and global reference current generator 112. Alternatively, the second reference voltage Vref2 may comprise the voltage that provides the write currents $I_{WL}$ and $I_{BL}$ (of FIG. 7) at node 130 in FIG. 4, if the fast on circuit 170 is coupled between the local write current generators 114 and the sub-arrays 116.

A signal START input to the transfer gate X1 triggers the charging of the second reference voltage to a predetermined voltage level. Signal START is turned high for a period of time at the beginning of the precharge signal PRE, and then the signal START may be dropped low, as a pulse, for example. When START is turned high, the fast on circuit 170 turns on and quickly generates a potential that is equivalent to the desired state of the external components T4 and T5, at Vref, which sets up a voltage potential at the negative input of the OpAmp. When the potential at the positive input of the OpAmp is higher than the negative input, then the OpAmp goes high, turning off transistor T2. When the potential at the positive input of the OpAmp is lower than the negative input, then the OpAmp output goes low and turns on transistor T2, which functions as a form of feedback control. As soon as node 136 or 130 reaches the desired potential, the OpAmp shuts off, and the PFET T2 turns off and no longer contributes to the potential of the external components T4 and T5. Therefore, advantageously, the fast on circuit 170 allows the node 136 or 130 to be turned off (e.g. the voltage potential is removed, and the current decreases or turns off) without taking an excessive amount of time to charge up the capacitance C1 of the lines 130/136.

Preferably, the elements T1, T2, T3, X1, INV1 and OpAmp comprise very small components, so that they do not require a lot of current to operate. The circuit 170 is preferably over-driven and turns off as soon as node 136 and 130 is charged up to the desired potential. Note that transistor T5 is shown coupled to a "no connect" NC; however, transistor T5 may comprise a diode connected NFET that may be coupled to another NFET gate and other components of a current mirror.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of writing information to a magnetic memory device, the magnetic memory device including a plurality of wordlines in a first wiring level positioned in a first direction, a plurality of bitlines in a second wiring level positioned in a second direction, and a plurality of magnetic memory cells, each magnetic memory cell being proximate an intersection of a wordline and a bitline, the magnetic memory device having a write path, the method comprising:
   precharging the write path of the magnetic memory device;
   after precharging, then selecting at least one magnetic memory cell; and
   writing to the at least one magnetic memory cell.

2. The method according to claim 1, wherein precharging the write path comprises precharging at least one of the wordlines to a first write voltage.

3. The method according to claim 2, wherein precharging at least one of the wordlines comprises precharging all of the wordlines to the first write voltage.

4. The method according to claim 2, wherein precharging the write path comprises precharging at least one of the bitlines to a second write voltage before selecting the at least one magnetic memory cell.

5. The method according to claim 4, wherein precharging at least one of the bitlines comprises precharging all of the bitlines to the second write voltage.

6. The method according to claim 3, wherein the magnetic memory cells are arranged in a plurality of sub-arrays, wherein a local write current generator is coupled to each sub-array, and a global reference current generator is coupled to each local write current generator, further comprising:
   sending a global reference current from the global reference current generator to each local write current generator;
   flowing the first write current from a local write current generator to the at least one magnetic memory cell; and flowing the second write current from the local write current generator to the at least one magnetic memory cell.

7. The method according to claim 6, further comprising precharging the inputs to the local write current generator before selecting the at least one magnetic memory cell.

8. The method according to claim 6, further comprising coupling a fast on circuit between the sub-arrays and the local write current generator or between the global reference current generator and the local write current generators.

9. The method according to claim 8, wherein coupling the fast on circuit comprises:
   coupling a first transistor to a first reference voltage;
   coupling a transfer gate to the first transistor;
   coupling an enable input of a comparator to the transfer gate;
   coupling a second transistor to an output of the comparator; and
   coupling a third transistor to an input of the comparator and the transfer gate, wherein an input of the comparator and the second transistor are coupled to a second reference voltage of the sub-array or the local write current generator, wherein a start signal input to the fast on circuit triggers the precharging of the second reference voltage of the sub-array or the local write current generator.

10. The method according to claim 6, wherein the global reference current generator comprises a precharge mode current reference generator and an active mode reference current generator, a control logic circuit coupled to the active mode reference current generator, the control logic circuit also being coupled to an oscillator, the oscillator being coupled to the precharge mode current reference generator, further comprising:
    generating the global reference current from either the precharge mode current reference generator in a precharge mode or from the active mode reference current generator in an active mode.

11. The method according to claim 10, further comprising sending a control signal to an input of the control logic circuit to select the precharge mode or the active mode.

12. The method according to claim 10, wherein the oscillator periodically signals the precharge mode current reference generator to recharge a voltage potential for the global reference current in the precharge mode.

13. The method according to claim 1, wherein writing to the at least one magnetic memory cell comprises:
    first, applying a first current to a wordline of the at least one selected magnetic memory cell; then
    second, applying a second current to a bitline of the at least one selected magnetic memory cell.

14. The method according to claim 13, wherein writing to the at least one magnetic memory cell further comprises, after applying the second current to the bitline of the at least one selected magnetic memory cell:
    third, removing the first current from the wordline of the at least one selected magnetic memory cell; then
    fourth, removing the second current from the bitline of the at least one selected magnetic memory cell.

15. The method according to claim 1, wherein the magnetic memory device comprises a magnetic random access memory (MRAM) device, and wherein the magnetic memory cells comprise magnetic tunnel junctions (MTJ's).

16. The method according to claim 1, wherein the time required to precharge the write path is hidden in an address decoding time or in a redundancy evaluation time of the magnetic memory device.

* * * * *